United States Patent [19]

Tuma et al.

[11] 4,214,360
[45] Jul. 29, 1980

[54] METHOD OF MAKING A RADIO FREQUENCY OSCILLATOR-MODULATOR WITH GROUND METALLIZATION

[75] Inventors: Wade B. Tuma, Campbell; Niles E. Strohl, Sunnyvale, both of Calif.

[73] Assignee: Atari, Inc., Sunnyvale, Calif.

[21] Appl. No.: 949,848

[22] Filed: Oct. 10, 1978

Related U.S. Application Data

[62] Division of Ser. No. 818,838, Jul. 25, 1977, Pat. No. 4,152,671.

[51] Int. Cl.² .................................................. H01R 43/00
[52] U.S. Cl. .............................................................. 29/829
[58] Field of Search ................. 29/626, 628; 174/52 R

[56] References Cited
U.S. PATENT DOCUMENTS

| | | | |
|---|---|---|---|
| 3,781,875 | 12/1973 | King | 174/52 R X |
| 3,816,911 | 6/1974 | Knappenberger | 174/52 R X |
| 4,019,141 | 4/1977 | Numan et al. | 174/52 R X |
| 4,149,027 | 4/1979 | Asher et al. | 174/52 R |

Primary Examiner—Francis S. Husar
Assistant Examiner—C. J. Arbes
Attorney, Agent, or Firm—Townsend & Townsend

[57] ABSTRACT

A radio frequency oscillator-modulator for use in a video game includes a folded metal shield box having a slot on one of its ends with which a similarly slotted printed circuit board containing the oscillator and modulator is mated. Circuitry of the oscillator and modulator provides for great linearity and low R.F. radiation. The slot arrangement provides for effective grounding of the ground metallization of the external portion of the printed circuit board which contains the radio frequency output terminal along with the various input terminals. This portion contains ground metallization which makes very effective electrical contact with the slot of the shield box thus again containing R.F. radiation.

6 Claims, 10 Drawing Figures

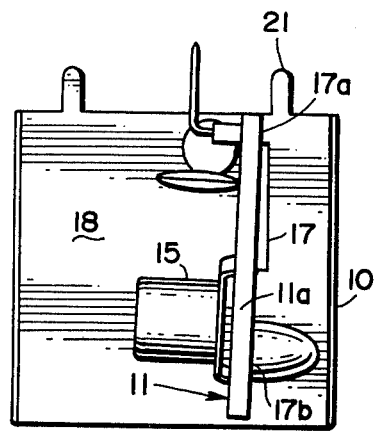
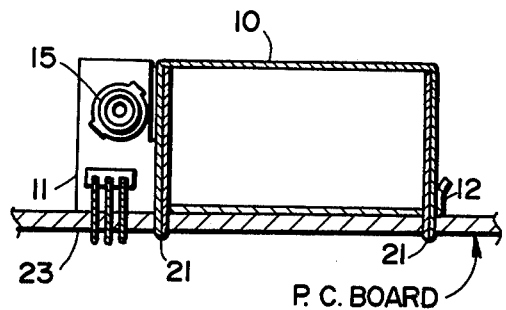
FIG. 3    FIG. 4
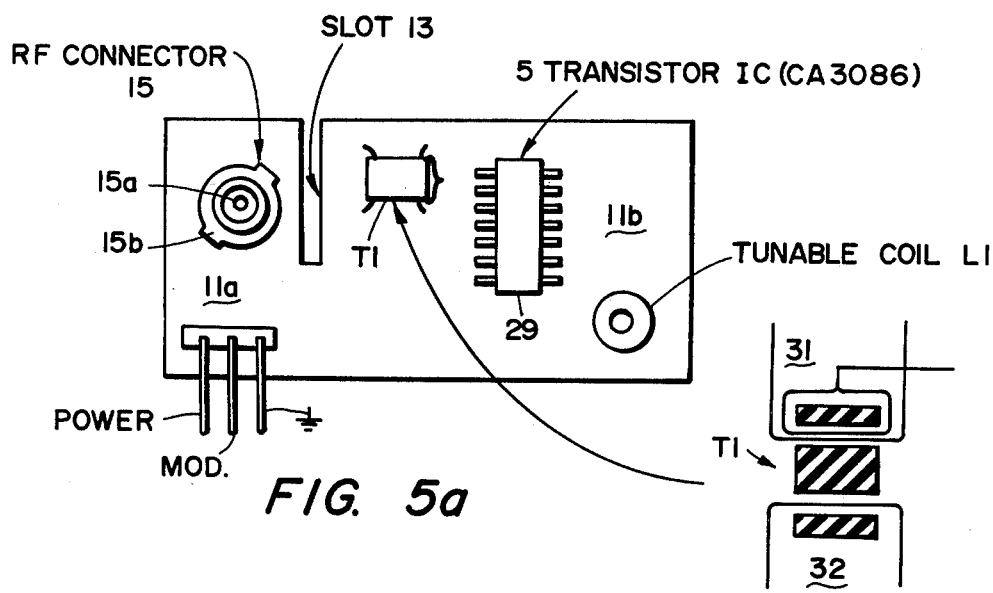
FIG. 5a
FIG. 5b
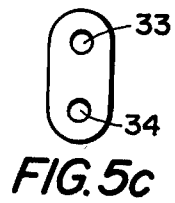
FIG. 5c

METHOD OF MAKING A RADIO FREQUENCY OSCILLATOR-MODULATOR WITH GROUND METALLIZATION

This is a division of application Ser. No. 818,838, filed July 25, 1977, now U.S. Pat. No. 4,152,671.

BACKGROUND OF THE INVENTION

The present invention is directed to an oscillator-modulator apparatus and method therefor and more specifically to apparatus for use in video games for home use.

In view of the requirements of the United States Federal Communications Commission (FCC) video games which attach to the antenna input terminal of a television receiver must be shielded to prevent excessive electromagnetic radiation. Such video games produce a radio frequency (R.F.) signal which is modulated by the game information. The R.F. signal may correspond to, for example, channel 3 (60–66 MHz) of the television spectrum.

Where the game information includes an audio component the construction of an oscillator-modulator which is sufficiently linear and with relatively low levels of R.F. radiation may be costly. This is illustrated by a standard television transmitter which has separate picture and sound modulators and R.F. oscillators until the transmitting antenna and then in some cases even uses separate antennas.

Finally in any consumer item, cost from both a raw material and production standpoint is crucial. This includes consistency of output characteristics in mass production.

One prior design which was used by the assignee of the present application in the video game "HOCKEY PONG" (trademark) consisted of a folded metal box shield containing a printed circuit board. This was found to be inadequate for many of the foregoing reasons.

OBJECTS AND SUMMARY OF THE INVENTION

It is, therefore, a general object of the invention to provide an improved radio frequency oscillator-modulator.

It is a more specific object of the invention to provide a device as above which is inexpensive yet has a low R.F. level, is easily mass produced with reliable operating characteristics, is highly linear with regard to both picture and audio modulating signals and is relatively insensitive to supply voltage variations.

In accordance with the above objects, there is provided a radio frequency oscillator-modulator which comprises a printed circuit board having mounted therein electrical components forming an oscillator and modulator on a first portion and a coaxial type radio frequency (R.F.) output terminal with ground and R.F. portions mounted on a second board portion. The terminal is effectively surrounded by ground metallization deposited on the board. The board has a slot extending into its interior at least partially separating the metallization and terminal of the second portion from the remaining first portion of the board. A metal box shaped R.F. shield contains the second portion of the board and has a side with slot means for mating with the slot of the board. The slot means also makes electrical contact with the ground metallization.

BRIEF DESCRIPTION OF THE DRAWINGS

FIG. 2 is a plan view of a metal cutout which is folded to form the box of FIG. 1a;

FIG. 3 is an assembled end view of FIGS. 1a and 1b;

FIG. 4 is a simplified cross sectional view of the assembly of FIGS. 1a–c inserted in a printed circuit board;

FIG. 5a is a simplified plan view of the opposite side of FIG. 1b;

FIGS. 5b and 5c are cross-sectional and end views of a component of FIG. 5a.

DETAILED DESCRIPTION OF THE PREFERRED EMBODIMENT

Figure 1C:
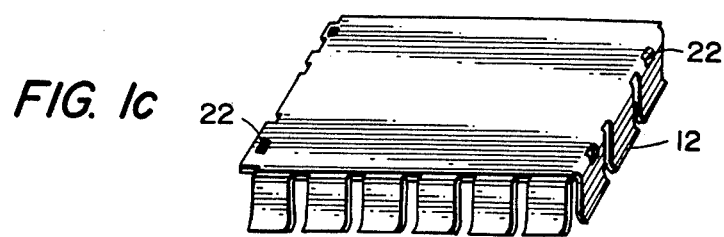
FIGS. 1a–c are perspective exploded views of a R.F. oscillator-modulator embodying the present invention.
Figure 1B:
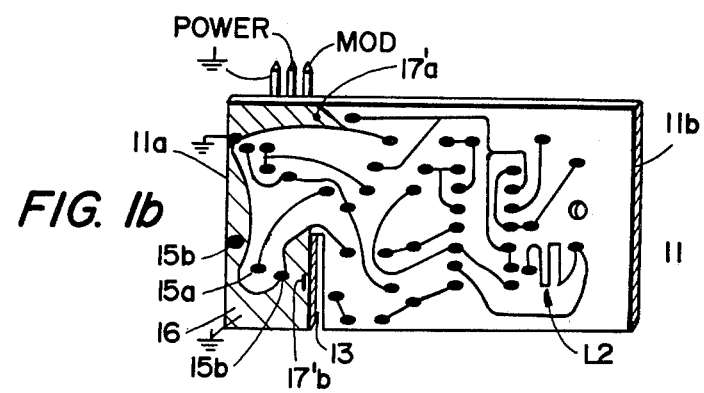
Figure 1A:
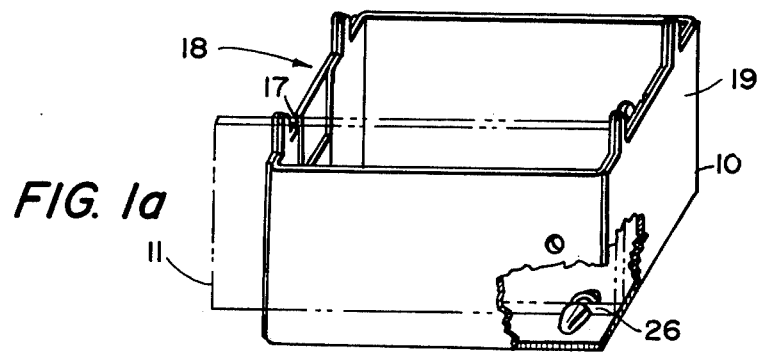

The radio frequency oscillator-modulator of the present invention consists of three components shown in the exploded views of FIGS. 1a, 1b, and 1c. These are a folded metal box shaped radio frequency (R.F.) shield 10, a printed circuit board 11 having all of the electrical components thereon and the metal lid or cap 12 of FIG. 1c for forming a total electromagnetic shield in combination with box 10 for at least a portion of printed circuit board 11.

Specifically, board 11 includes a first portion 11a and a second portion 11b which are separated by the slot 13 extending from the bottom edge into the interior of the printed circuit board. Portion 11a carries all of the input terminals; specifically, power, the modulation signal and ground. And on its opposite side, as indicated in FIG. 5a a R.F. output terminal or connector 15 which has a coaxial inner R.F. terminal 15a and an outer grounded shield 15b. The connection of 15a is illustrated the opposite side in FIG. 1b. The outer grounded shield of the coaxial terminal is connected to the ground metallization 16 which extensively covers the portion 11a of printed circuit board 11 and effectively surrounds R.F. terminal 15.

Figure 2:
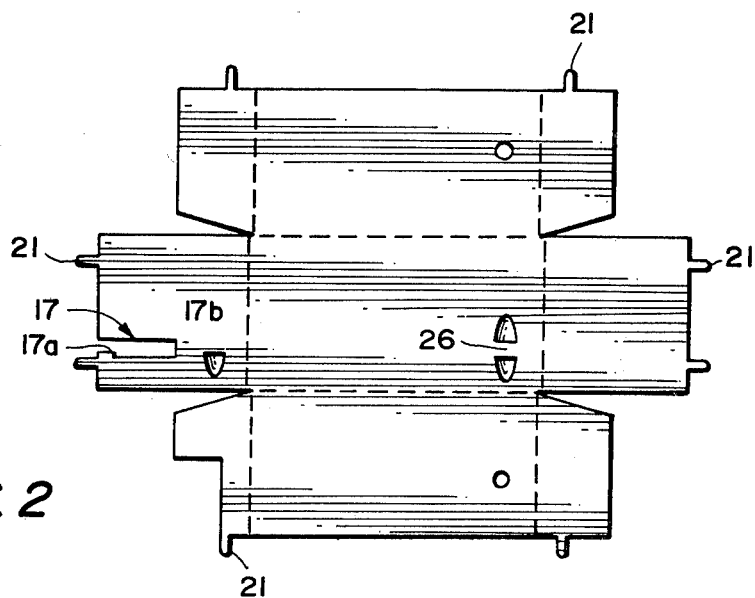

Shield box 10, as best shown in FIG. 2, includes a slot 17 which mates with the board slot 13 as shown by the phantom view of board 11 in FIG. 1a. FIG. 2 is a precut metal sheet with the fold lines being shown which will form the shield box 10. When the box is folded, the sheet metal forming the ends 18 and 19 of the box are generously overlapped to effectively reduce R.F. leakage. The foldout of FIG. 2 also includes several tabs 21 which in the folded up state shown in FIG. 1a form adjacent pairs and in combination with the holes 22 in lid 12 through which the tabs 21 will extend forms a relatively rigid structure.

Also in its assembled state the tabs 21, as illustrated in FIG. 4, may be used to mount the entire modulator-oscillator on a printed circuit board 23. Here the tabs may be soldered to provide a very effective ground at four locations to the printed circuit board 23.

As best illustrated in FIG. 2 slot 17 includes at one end a nub 17a and near the opposite end a second nub 17b. As best shown in FIG. 3 when the board 11 is inserted in slot 17 the nub 17b provides a twisting action twisting the board portion 11a with respect to the portion 11b. This causes a very effective electrical contact to be made to the ground metallization 16 at both nubs 17a and 17b. These points are indicated in FIG. 1b as 17'a and 17'b. In other words, the twisting action provided by the slot and the nubs force the ground metallization to scrape along the nubs 17a, b to produce two electrical connections. A further retention slot 26 formed in the bottom of the box is illustrated in FIGS. 1a and FIG. 2 to provide for locating printed circuit board 11 as it is mated or inserted into box 10.

The extensive metallization 16 which effectively surrounds the radio frequency output terminal 15 and the fact that it is grounded reduces the radio frequency radiation of the external portion 11a of the printed circuit board to a minimum.

Figure 6:
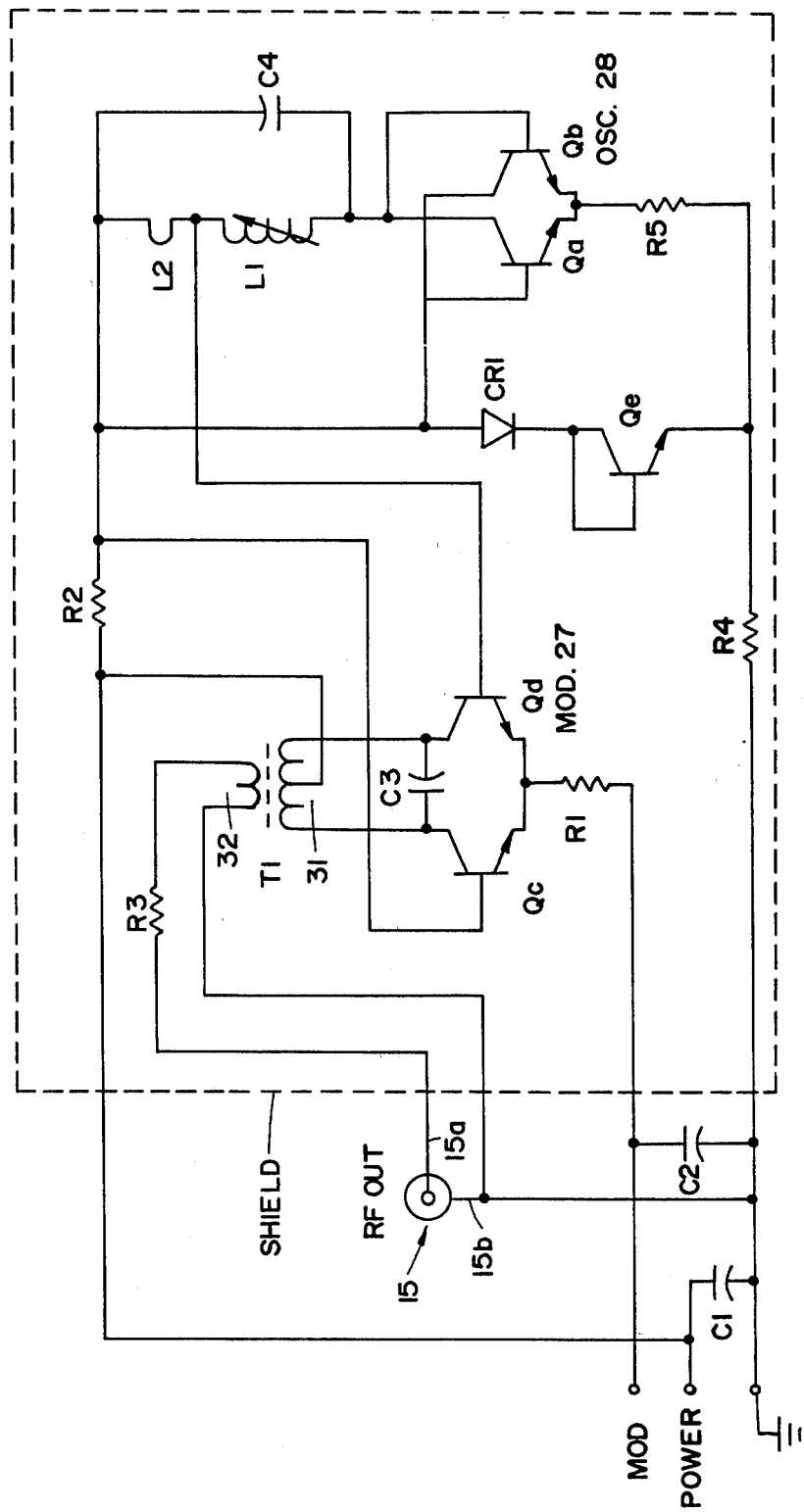
FIG. 6 is a circuit schematic of FIG. 1b.

Referring now to the circuit of FIG. 6 in conjunction with the actual showing of some of the components of FIGS. 5a through 5c, in general the circuit includes a modulator 27 having a differentially coupled pair of transistors $Q_c$ and $Q_d$ and an oscillator 28 having a pair of differentially connected transistors $Q_a$ and $Q_b$. There is a fifth transistor, $Q_e$ which is connected as a diode and all of the five transistors are contained in a five transistor integrated circuit 29 (FIG. 5a) which is of the industry type CA3086. The transistor pairs $Q_a$, $Q_b$ and $Q_c$, $Q_d$ all have their bases dc coupled together and in addition there is an effective zero volts bias between the base and collector of each of them.

The oscillator transistors $Q_a$ and $Q_b$ utilize feedback from the collector of $Q_a$ to the base $Q_b$ to provide the oscillation. L1 is a tunable coil to adjust the oscillating frequency along with the fixed inductor L2 with the remainder of the tank circuit including capacitor C4. The oscillator takeoff is between L1 and L2. L2 is quite small and therefore is incorporated as part of printed circuit board 11.

Power supply regulation means which makes the circuit relatively immune to variations such as from one to nine volts in supply voltage includes the diode connected transistor $Q_e$ and series connected diode CR1. The transistor $Q_e$ acts like a Zener voltage regulator and, of course, since it is on the same integrated circuit chip matches exactly the characteristics of $Q_a$ and $Q_b$. The voltage drop across resistor R5 determines the current and this in effect controlled by the drop across diode CR1 which is 7/10 volt. Thus, variations in the power supply voltage will not affect the operation of the oscillator circuit.

Resistor R2 provides a minimal 1/10 volt drop between the power input and the oscillator circuit 28. The resistor R4 is for the purpose of minimizing current in the diode CR1 and is not critical.

The modulator 27 formed by differential pair $Q_c$ and $Q_d$ is a transconductance type modulator utilizing the current limiting characteristics of this configuration. Modulation is supplied as a current sink at the modulation (MOD.) input through resistor R1 with the radio frequency potential appearing at the transformer T1 primary 31. This primary is center tapped to the power input. High frequency signals are filtered out by parallel connected bypass capacitor C3. For example, signals which are twice the carrier frequency. Transformer secondary 32 supplies the radio frequency potential to R.F. output jack or terminal 15.

Transformer T1 is also shown in FIGS. 5a through 5c and is actually a ferrite balun which includes two holes 33 and 34. Hole 33 is for the primary coil 31 and hole 34 for the secondary 32. Such ferrite transformer provides a low frequency cutoff point by reason of its leakage reactive so that the transformer T1 in combination with high frequency bypass capacitor C3 effectively acts as a bandpass filter.

OPERATION

In actual use the oscillator-modulator of the present invention would have applied to its modulation terminal the channel 3 television frequency band of from 60 to 66 MHz with the picture carrier signal being at 61.25 MHz. Also contained in this modulation signal is a frequency modulated sound signal having a carrier at 65.75 MHz. Because of both the linearity of the modulator of the present invention and the fact that proper filtering and shielding is provided picture and sound modulation can be done in a single modulator.

To summarize from a filtering standpoint, the transformer T1 which is in the form of a ferrite bead in a bandpass filter because its leakage reactance cuts out lower frequencies and the bypass capacitor C3 eliminates higher frequencies. From a linearity standpoint the zero volts bias achieved by connecting collectors to the bases and the common base connection provides relatively linear operation. In addition the Zener diode like voltage regulation utilizing the diode CR1 and diode connected transistor $Q_e$ determines a constant current through the oscillator. In addition, as discussed above, it also makes the oscillator insensitive to supply voltage changes of the range, for example, from 1 to 9 volts. This is especially important where the oscillator modulator may be used in many different types of video games in many environments. Finally from a electromagnetic radiation point of view, the oscillator's peak to peak or swing voltage is also limited by the zero bias voltage between base and collector and the common base connection.

From a cost standpoint, this type of biasing eliminates the many components normally required for biasing and is very inexpensive. From a construction standpoint, once the turnable coil L1 is adjusted at the factory the unit maintains its frequency stability throughout its life. Moreover, component variations as, for example, in the five transistor integrated circuit unit of even a relatively large magnitude can be tolerated. Therefore such IC unit may be of relatively low cost.

Thus an improved radio frequency oscillator-modulator has been provided.

We claim:

1. A method of forming a radio frequency oscillator-modulator comprising the following steps: providing a printed circuit board with a radio frequency coaxial terminal, an oscillator and modulator, ground metallization effectively surrounding said radio frequency coaxial terminal, and a slot adjacent said metallization; forming a metal box with a slot from a single metal sheet; mating said slot of said box with said slot of said board to place said oscillator and modulator within said box and concurrently a portion of at least one side of said slot of said box making direct electrical contact with said metallization.

2. A method as in claim 1 together with the step of placing a metal lid on said box to form a complete R.F. shield.

3. A method as in claim 1 where said box is formed by folding a precut metal sheet with the ends of the box being overlapped to reduce R.F. leakage.

4. A method as in claim 3 where said overlapped ends include adjacent tabs, and further including the steps of placing a metal lid on said box through which said tabs extend, and affixing said box to an associated circuit board by means of said tabs.

5. The method of claim 1 wherein said step of forming includes the step of providing a first nub portion extending partially across the width of said box slot adjacent the open end thereof, and wherein said step of mating includes the step of engaging the edge of said first nub portion with said metallization to promote effective electrical contact therebetween.

6. The method of claim 5 wherein said step of forming further includes the step of providing a second nub portion in the wall of said box containing said box slot at a position between the closed end of said box slot and the bottom of said box, said second nub portion having an abutment edge located at a position laterally offset from the edge of said box slot from which said first nub portion extends, and wherein said step of mating further includes the step of engaging said abutment edge of said second nub portion with said metallization to promote effective electrical contact therebetween.

* * * * *